(12) United States Patent
Han

(10) Patent No.: US 12,347,493 B2
(45) Date of Patent: Jul. 1, 2025

(54) MEMORY PACKAGED CHIP AND SIGNAL PROCESSING METHOD THEREFOR

(71) Applicant: WUHAN XINXIN SEMICONDUCTOR MANUFACTURING CO., LTD., Wuhan (CN)

(72) Inventor: Zhiyong Han, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 176 days.

(21) Appl. No.: 18/025,399

(22) PCT Filed: Dec. 16, 2020

(86) PCT No.: PCT/CN2020/136717
§ 371 (c)(1),
(2) Date: Mar. 9, 2023

(87) PCT Pub. No.: WO2022/052354
PCT Pub. Date: Mar. 17, 2022

(65) Prior Publication Data
US 2023/0335195 A1    Oct. 19, 2023

(30) Foreign Application Priority Data
Sep. 9, 2020   (CN) .......................... 202010941364.5

(51) Int. Cl.
| G11C 16/08 | (2006.01) |
| G11C 16/26 | (2006.01) |
| H01L 25/18 | (2023.01) |

(52) U.S. Cl.
CPC .............. *G11C 16/08* (2013.01); *G11C 16/26* (2013.01); *H01L 25/18* (2013.01)

(58) Field of Classification Search
CPC ......... G11C 16/08; G11C 16/26; G11C 16/32; G11C 5/066; G11C 7/1078; G11C 7/109;
(Continued)

(56) References Cited

U.S. PATENT DOCUMENTS

| 9,432,298 B1* | 8/2016 | Smith ................. H04L 49/9057 |
| 2019/0155753 A1 | 5/2019 | Zhu et al. |
| 2019/0325167 A1 | 10/2019 | Hershman et al. |

FOREIGN PATENT DOCUMENTS

| CN | 103219333 A | 7/2013 |
| CN | 103247612 A | 8/2013 |

(Continued)

OTHER PUBLICATIONS

Expansion Chip and Expanding Chip System and Control Method (Year: 2015).*

(Continued)

*Primary Examiner* — Sultana Begum
(74) *Attorney, Agent, or Firm* — PV IP PC; Wei Te Chung

(57) ABSTRACT

A memory packaged chip and a signal processing method therefor are provided. The memory packaged chip includes at least a memory chip and an expander chip capable of receiving a same external input signal; there are a pair of inter-chip pins connected to each other between the memory chip and the expander chip; and the memory chip generates a first control signal according to the external input signal, and transmit the first control signal to the expander chip through the pair of inter-chip pins to disable or enable an input function of the expander chip.

20 Claims, 6 Drawing Sheets

(58) Field of Classification Search
CPC ... G11C 8/12; G11C 2029/0411; H01L 25/18; H01L 25/065; H01L 23/3107
See application file for complete search history.

(56) References Cited

FOREIGN PATENT DOCUMENTS

| | | | |
|---|---|---|---|
| CN | 103247613 A | | 8/2013 |
| CN | 103258820 A | | 8/2013 |
| CN | 103258821 A | | 8/2013 |
| CN | 103280444 A | | 9/2013 |
| CN | 104598405 A | * | 5/2015 |
| CN | 111816646 A | | 10/2020 |

OTHER PUBLICATIONS

International Search Report in International application No. PCT/CN2020/136717, mailed on Apr. 30, 2021.
Written Opinion of the International Search Authority in International application No. PCT/CN2020/136717, mailed on Apr. 30, 2021.
Chinese Office Action issued in corresponding Patent Application No. 202010941364.5 dated Oct. 30, 2020, pp. 1-7.

* cited by examiner

MEMORY PACKAGED CHIP AND SIGNAL PROCESSING METHOD THEREFOR

CROSS-REFERENCE TO RELATED APPLICATIONS

The present application is a U.S. national phase application of a PCT Application No. PCT/CN2020/136717 filed on Dec. 16, 2020, which claims priority to a Chinese Patent Application No. 202010941364.5 filed on Sep. 9 2020, the disclosures of which are incorporated in their entirety by reference herein.

FIELD OF DISCLOSURE

The present application relates to a technical field of semiconductors, and more particularly to a memory packaged chip and a signal processing method therefor.

BACKGROUND OF DISCLOSURE

Memory is memory devices in computer systems. Memory is configured to store programs and data. In computers, all information including original data that are input, computer programs, intermediate operation results and final operation results is stored in memory. In recent years, with rapid development in semiconductor memory, memory, especially flash memory, has become memory that is commonly used in computers and mobile communication terminals because of having advantages of high density, low power consumption, and low price.

An enhanced memory chip with a replay protection monotonic counter (RPMC for short) usually integrates a flash chip and an RPMC chip into a single bare chip, for example. The flash chip is configured to store codes and data of a basic input-output system (BIOS for short) of a central processing unit (CPU for short). The RPMC chip is configured to ensure confidentiality and integrity of reading and writing data. The RPMC chip and the flash chip that is integrated with the RPMC chip together constitute a hardware platform of the BIOS in a personal computer (PC for short) system.

A technical problem is as follows. A flash chip supports a single-bit serial peripheral interface (SPI for short) mode and a multi-bit quad peripheral interface (QPI for short) mode. But a replay protection monotonic counter (RPMC) chip only supports the SPI mode. When the flash chip and the RPMC chip are stacked and packaged together, because the flash chip and the RPMC chip cannot be completely maintained in a same state, i.e., because the two chips cannot be effectively synchronized, a packaged chip only supports the SPI mode. Because of limitation of industrial applications, the number of pins of the packaged chip is often limited. Thus, pin sharing is required between the flash chip and the RPMC chip. The pin sharing can cause misreading of a signal, resulting in the RPMC chip mis-decoding the signal.

SUMMARY OF DISCLOSURE

An object of the present application is to provide a memory packaged chip and a signal processing method therefor which can prevent misreading of a signal, prevent mis-operation by an RPMC chip, enhance stability of the RPMC chip, and at the same time facilitate a testing of the RPMC chip or an application of the RPMC chip that is individually packaged.

An embodiment of the present application provides a memory packaged chip, including a package body, wherein an inner part of the package body includes at least a memory chip and an expansion chip capable of receiving a same external input signal; wherein there are a pair of inter-chip pins connected to each other between the memory chip and the expansion chip; wherein the memory chip is further configured to generate a first control signal according to the external input signal, and transmit the first control signal to the expansion chip through the pair of inter-chip pins to disable or enable an input function of the expansion chip; and wherein when the input function of the expansion chip is disabled, transmission of the external input signal in the expansion chip is prohibited; and when the input function of the expansion chip is enabled, the transmission of the external input signal in the expansion chip is allowed.

In order to achieve the aforementioned objective, another embodiment of the present application provides a signal processing method for the memory packaged chip, wherein an inner part of a package body of the memory packaged chip includes at least a memory chip and an expansion chip, and there are a pair of inter-chip pins connected to each other between the memory chip and the expansion chip; and the method includes the following steps: by the memory chip and the expansion chip, receiving a same external input signal; by the memory chip, decoding the external input signal and generating a first control signal; by the memory chip, transmitting the first control signal to the expansion chip through the pair of inter-chip pins; by the expansion chip, receiving the first control signal, and disabling or enabling an input function of the expansion chip according to the first control signal; wherein when the input function of the expansion chip is disabled, transmission of the external input signal in the expansion chip is prohibited; and when the input function of the expansion chip is enabled, the transmission of the external input signal in the expansion chip is allowed.

Advantageous effects are as follows. In the present application, by arranging a pair of inter-chip pins connected to each other between a memory chip and an expansion chip in an inner part of a package body, the memory chip can transmit, through the pair of inter-chip pins, a first control signal that disables or enables an input function of the expansion chip to the expansion chip. When the input function of the expansion chip is disabled, transmission of the external input signal in the expansion chip is prohibited regardless of a state of the expansion chip. Thus, the two chips are in a non-synchronous state, which can prevent the expansion chip from misreading the signal, and enhance stability of the expansion chip. By further configuring a second control signal in the expansion chip to select receiving the first control signal or select enabling the input function of the expansion chip, a testing of the expansion chip or an application of the expansion chip that is individually packaged is applicable. In the present application, by controlling the expansion chip through the first control signal and the second control signal, the input function of the expansion chip can be disabled without putting the expansion chip into a standby mode and without changing a control command executing program in the expansion chip. Because the expansion chip does not need to be set into a standby mode, the expansion chip does not need to be "waken up" when the expansion chip is enabled again, which speeds up overall response speed of a system. Thus, when a command needs to be input to the expansion chip, only the corresponding control signal needs to be changed, and then the expansion chip can respond quickly only through simple logic operation, so that the external input signal can be transmitted normally in the expansion chip. In addition, a pin arrangement of a memory packaged chip can be compatible with an existing pin packaging process of a memory chip, reducing difficulty of a packaging process, and improving an application range of the memory packaged chip that is packaged.

DETAILED DESCRIPTION OF EMBODIMENTS

In order to make the objects, technical solutions, and advantages of the present application more clearly, the present application is further described in detail below with embodiments with reference to the accompanying drawings. It is understood that the specific embodiments described herein are merely illustrative of the present application and are not intended to limit the present application.

Figure 1:
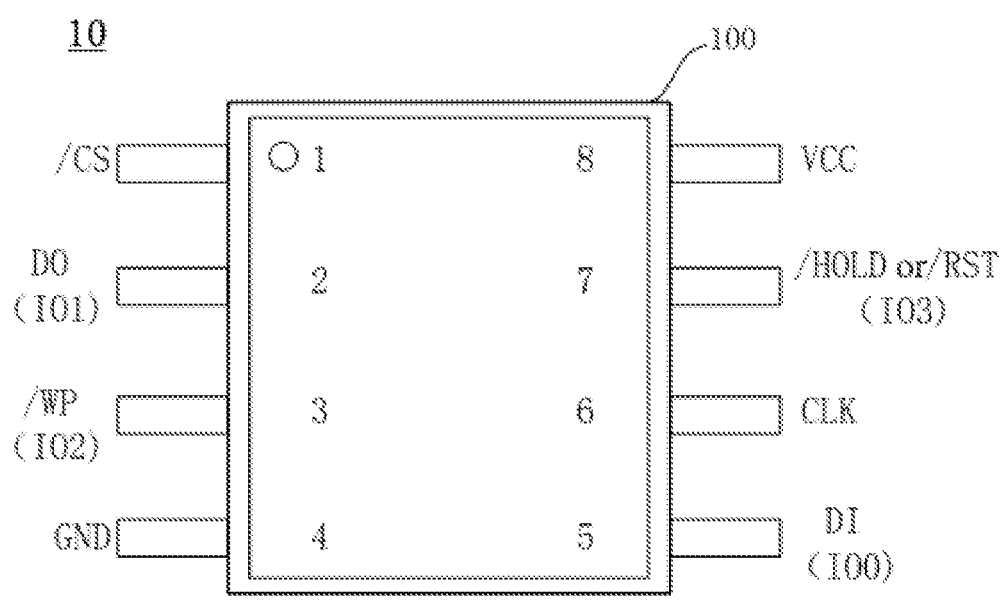
FIG. 1 is a top view of a memory packaged chip provided according to a first embodiment of the present application.
Figure 2:
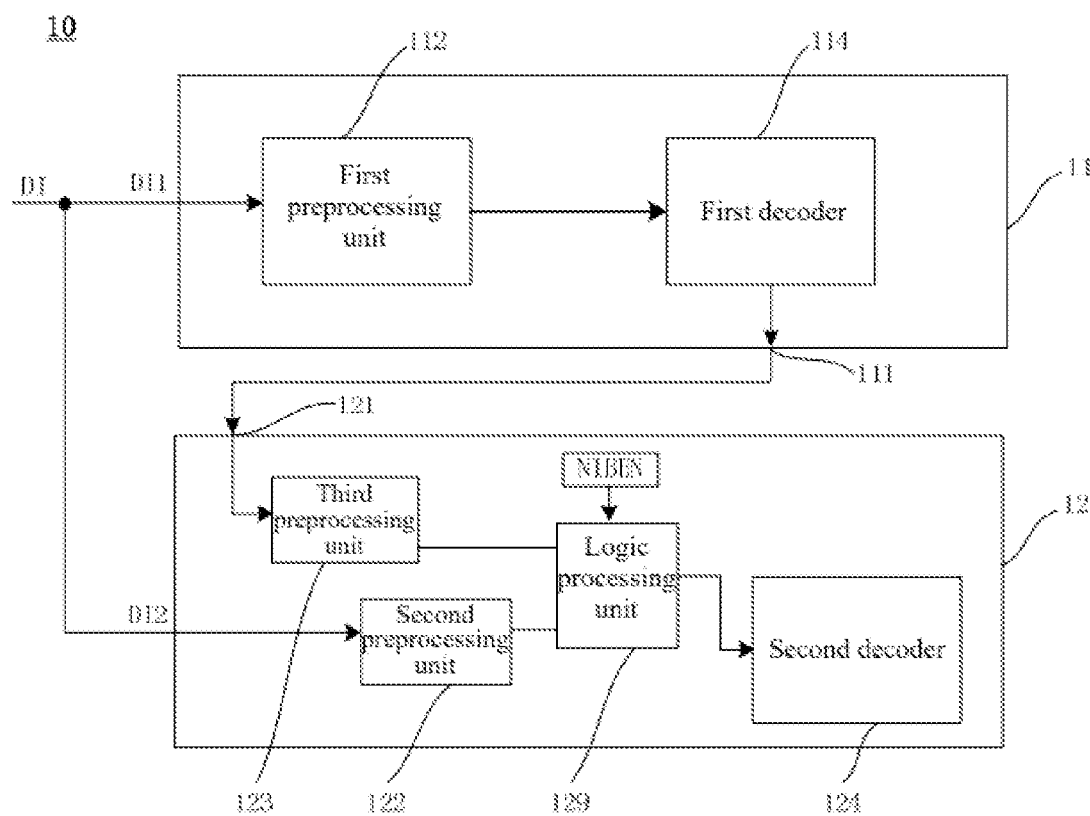
FIG. 2 is a diagram of a logic connection structure in an inner part of the memory packaged chip illustrated in FIG. 1.
Figure 3:
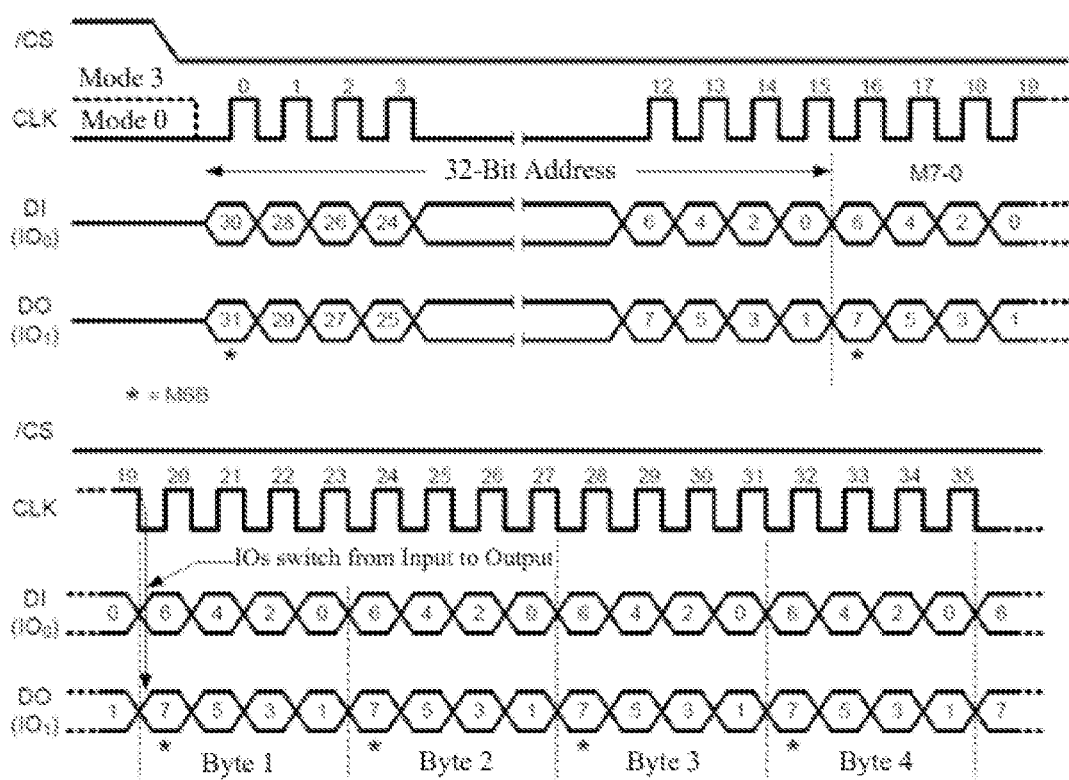
FIG. 3 is a signal waveform diagram of some pins of the memory packaged chip illustrated in FIG. 1.

Referring to FIGS. 1-3, FIG. 1 is a top view of a memory packaged chip provided according to a first embodiment of the present application. FIG. 2 is a diagram of a logic connection structure in an inner part of the memory packaged chip illustrated in FIG. 1. FIG. 3 is a signal waveform diagram of some pins of the memory packaged chip illustrated in FIG. 1.

As illustrated in FIG. 1, in the present embodiment, the memory packaged chip 10 uses an 8-pin package (pins 1-8) and includes a package body 100. An inner part of the package body 100 includes a memory chip 11 and an expansion chip 12 (illustrated in FIG. 2) capable of receiving a same external input signal. There are a pair of inter-chip pins 111 and 121 (illustrated in FIG. 2) connected to each other between the memory chip 11 and the expansion chip 12. The memory chip 11 is further configured to generate a first control signal according to the external input signal, and transmit the first control signal to the expansion chip 12 through the pair of inter-chip pins 111 and 121 (arrows illustrated in the figure represent a direction of signal transmission) to disable or enable an input function of the expansion chip 12. When the input function of the expansion chip 12 is disabled, the transmission of the external input signal in the expansion chip 12 is prohibited. When the input function of the expansion chip 12 is enabled, the transmission of the external input signal in the expansion chip 12 is allowed. It should be noted that the inner part of the package body 100 can also include a plurality of memory chips 11 to achieve further expanded memory chip capacity.

In a further embodiment, there are a pair of input sharing pins DI1 and DI2 (illustrated in FIG. 2) between the memory chip 11 and the expansion chip 12. The pair of input sharing pins DI1 and DI2 are configured to receive the external input signal. The pair of input sharing pins DI1 and DI2 are both connected to a same external input pin DI on the package body 100. Thus, the memory chip 11 and the expansion chip 12 can both receive the same external input signal through the external input pin DI. The external input signal can be a command signal, an address signal, data, or the like. Of course, the external input signal is not limited to the signal input from the pair of input sharing pins DI1 and DI2. The external input signal can alternatively be a signal input from other pins. The external input signal can be replaced by a plurality of signals input from a plurality of different pairs of input sharing pins. According to at least one control requirement, logic operation is performed on the plurality of signals, and then the memory chip 11 sends a control signal to the expansion chip 12.

Specifically, in the present embodiment, the package body 100 includes a plurality of external pins thereon. There are a plurality of pairs of sharing pins between the memory chip 11 and the expansion chip 12. The plurality of pairs of sharing pins correspond to the plurality of external pins. Each pair of the sharing pins are both connected to a corresponding same one of the plurality of external pins. That is, pins with a same function that are on the memory chip 11 and the expansion chip 12 can be used as a pair of sharing pins that are connected to a same external pin. Both the memory chip 11 and the expansion chip 12 can receive a signal sent externally and can thus respond accordingly.

In a further embodiment, all of the external pins on the package body 100 are external shared pins. The external pins include a chip select pin/CS, an output pin DO, a write protection pin/WP, a ground pin GND, an input pin DI, a clock pin CLK, an external command shield pin/HOLD (or a reset pin/RST), and a power supply pin VCC. The memory packaged chip 10 can use quad-channel IO (IO0-IO3). In a serial peripheral interface (SPI) mode, IO0 is used as the input pin DI, IO1 is used as the output pin DO, IO2 is used as the write protection pin/WP, and IO3 is used as the external command shield pin/HOLD or the reset pin/RST. The external command shield pin/HOLD is useful when a plurality of chips share same SPI signals. When the external command shield pin/HOLD is low and the chip select pin/CS is low, the output pin DO will be at high impedance and signals on the input pin DI and the clock pin CLK will be ignored. When the external command shield pin/HOLD is high, chip operation can be resumed. In the SPI mode, when IO3 is used as the reset pin/RST, when the pin receives a reset signal, registers corresponding to the chip are reset or initialized and thus a corresponding program can be re-executed. A pin arrangement of the memory packaged chip 10 can be compatible with an existing pin packaging process of a memory chip, reducing difficulty of a packaging process, and improving an application range of the memory packaged chip that is packaged.

As illustrated in FIG. 2, there are a pair of input sharing pins DI1 and DI2 between the memory chip 11 and the expansion chip 12. The pair of input sharing pins DI1 and DI2 are configured to receive the same external input signal. The pair of input sharing pins DI1 and DI2 are connected to a same external input pin DI. Thus, the memory chip 11 and the expansion chip 12 can both receive the same external input signal through the external input pin DI. The external input signal can be a command signal, an address signal, data, or the like.

There are a pair of inter-chip pins 111 and 121 connected to each other between the memory chip 11 and the expansion chip 12. The memory chip 11 is further configured to generate a first control signal according to the external input signal, and transmit the first control signal to the expansion chip 12 through the pair of inter-chip pins 111 and 121 (arrows illustrated in the figure represent a direction of signal transmission; that is, the signal transmission on the pair of inter-chip pins 111 and 121 is unidirectional and is only from the memory chip 11 to the expansion chip 12) to disable or enable an input function of the expansion chip 12. A spacing between the two chips and a side-by-side arrangement of the two chips illustrated in the figure are only for convenience of schematic illustration and do not limit an actual spacing between the two chips and a specific arrangement of the two chips in the inner part of the package body 100. The two chips can also use a vertical stack arrangement.

Because the external pin is shared, the memory chip 11 and the expansion chip 12 receive the same external input signal. (Execution starts after the pin/CS is brought to a low level.) After the memory chip 11 receives a multi-channel continuous read command signal and an address signal, according to a continuous read mode enable signal which is in the external input signal and is in a condition that enables a continuous read mode, for a next read command, a read command code does not need to be input, and a read address can be input directly. In this case, the expansion chip 12 may mistakenly treat the read address input this time for the memory chip 11 as a read command for the expansion chip 12, thereby causing the expansion chip 12 to mis-decode it. In the present embodiment, after the memory chip 11 receives a multi-channel continuous read command signal and an address signal, according to a continuous read mode enable signal in the external input signal, the first control signal that disables the input function of the expansion chip 12 is transmitted through the pair of inter-chip pins to prohibit transmission of the external input signal in the expansion chip 12. Thus, the expansion chip 12 does not misread the external input signal, preventing the expansion chip 12 from mis-decoding the external input signal of the read address.

In the present embodiment, the memory chip 11 is an SPI flash chip. The expansion chip 12 is a replay protection monotonic counter (RPMC) chip. The SPI flash chip and the RPMC chip use their respective internal communication pins NIB as the inter-chip pins 111 and 121, respectively. The expansion chip 12 can also be another chip that can share an external pin with the memory chip 11 and that along with the memory chip 11 can have a pair of inter-chip pins connected to each other. For example, the expansion chip 12 can be a field-programmable gate array (FPGA for short). The FPGA can be provided with an RPMC and configuration information.

The SPI flash chip supports continuous reads of fast read dual-channel IO (fast read dual IO), fast read quad-channel IO (fast read dual TO), and word read quad-channel IO (fast read dual IO). For example, after a multi-channel continuous read command is received and bits (A31-0) of an address are input, bits (M7-0) of a continuous read mode are set to enable the continuous read mode, thereby further reducing command overhead. The multi-channel continuous read command can be a command of a continuous read of the fast read dual-channel TO, a command of a continuous read of the fast read quad-channel TO, or a command of a continuous read of the word read quad-channel IO. If an M5 bit and an M4 bit in the bits of the continuous read mode are 1 and 0, respectively, (i.e., M5-4=(1, 0)), the continuous read mode is enabled, for a next read command (after the pin/CS is brought high and then the pin/CS is brought low), a read command code does not need to be input, and a read address is allowed to be input immediately after the pin/CS is brought low, as illustrated in FIG. 3. Thus, faster reads are provided. If, in the bits of the continuous read mode, M5≠(1, 0), for a next read command (after the pin/CS is brought high and then the pin/CS is brought low), a read command code needs to be input, thereby returning to normal operation. A most significant bit (MSB) is generally located at a leftmost place of a binary number. If MSB=1, it means that data is a negative. If MSB=0, it means that data is positive. In the figure,*=MSB. Then, a high bit (31th bit or 7th bit illustrated in the figure) appear first.

Because the external pin is shared, the SPI flash chip and the RPMC chip receive the same external input signal. (Execution starts after the pin/CS is brought to a low level.) When the SPI flash chip is in a situation in which the continuous read mode is enabled, for a next read command, a read command code does not need to be input, and a read address can be input directly. In this case, the RPMC chip may mistakenly treat the read address input this time for the SPI flash chip as a read command for the RPMC chip, thereby causing the RPMC chip to mis-decode it. In the present embodiment, the SPI flash chip generates, according to a continuous read mode enable signal in the external input signal, a first control signal that disables an input function of the RPMC chip and transmits the first control signal to the RPMC chip through the internal communication pins NIB so that the input function of the RPMC chip is disabled, transmission of the external input signal in the RPMC chip is prohibited, and thus the external input signal is not misread. In this way, the RPMC chip is prevented from mis-decoding the external input signal of the read address.

In a further embodiment, the inner part of the expansion chip 12 is provided with a logic processing unit 129. The logic processing unit 129 is configured to perform logic operation on the external input signal and the first control signal to prohibit or allow transmission of the external input signal. When the first control signal is a signal that disables the input function of the expansion chip 12, the logic processing unit 129 prohibits a forward transmission of the external input signal received by the expansion chip 12 (through its input sharing pin DI2). That is, the input function of the expansion chip 12 is disabled. When the first control signal is a signal that enables the input function of the expansion chip 12, the logic processing unit 129 allows the downward transmission of the external input signal received by the expansion chip 12 so that a subsequent decoding operation can be performed. That is, the input function of the expansion chip 12 is enabled.

In a further embodiment, the expansion chip 12 is further configured to configure a second control signal to select receiving the first control signal or select enabling the input function of the expansion chip 12. When the expansion chip 12 is individually tested or individually packaged, the inter-chip pin 121 of the expansion chip 12 is in a floating state. Because the inter-chip pin 121 is not connected to the inter-chip pin 111 of the memory chip 11, at this time, the expansion chip 12 does not need to receive the first control signal transmitted by the memory chip 11. In order to prevent signals (including the first control signal) input through the inter-chip pin 121 of the expansion chip 12 from affecting normal reads of the chip and thus affecting test accuracy or performance of the chip itself, in the present embodiment, in the expansion chip 12, a second control signal is configured for reception of the first control signal to be selected or direct enablement of the input function of the expansion chip 12 to be selected.

For example, for the RPMC chip, at least one state bit NIBEN is stored in the inner part of the RPMC chip. By setting a value of the at least one state bit NIBEN, the corresponding second control signal can be generated. For example, when the RPMC chip is in a state of being individually tested or individually packaged, by setting the value of the at least one state bit NIBEN to 0 (the value of the at least one state bit NIBEN can be set before leaving the factory and can also be changed by an external command input by a user according to his/her need), the input function of the RPMC chip is directly enabled so that the RPMC chip can normally receive external input signals. Optionally, at the same time, the internal communication pin NIB is prohibited from receiving signals. When a testing of the RPMC chip is finished and the RPMC chip is packaged together with the SPI flash chip, by setting the value of the at least one state bit NIBEN to 1 (the value of the at least one state bit NIBEN can be set before leaving the factory and can also be changed by an external command input by the user according to user's need), the first control signal transmitted through the internal communication pin NIB can be normally received. An advantage of configuring the at least one state bit NIBEN and the corresponding second control signal is that when the internal communication pin NIB is in a floating state, normal reception of the external input signal by the RPMC chip can be ensured.

In a further embodiment, the logic processing unit 129 is configured to perform logic operation on the external input signal, the first control signal, and the second control signal to prohibit or allow the transmission of the external input signal in the expansion chip 12. When the second control signal is configured to select enabling the input function of the expansion chip 12, a signal that enables the input function of the expansion chip 12 is output, and transmission of the first control signal is prohibited. When the second control signal is configured to select receiving the first control signal, the transmission of the external input signal is controlled by the first control signal. That is, when the first control signal is a signal that disables the input function of the expansion chip 12, the transmission of the external input signal in the expansion chip 12 is prohibited. When the first control signal is a signal that enables the input function of the expansion chip 12, the transmission of the external input signal in the expansion chip 12 is allowed.

The following is to be noted. The logic processing unit 129 can consist of a circuit that include a logic device. Specifically, the logic device includes, but are not limited to, an analog logic device and a digital logic device. The analog logic device is a device configured to process an analog electrical signal, and includes, but are not limited to, a combination of one or more logic devices such as a comparator, a Schmitt, an inverter, an AND gate, and an OR gate. The digital logic device is a device configured to process a digital signal represented by a pulse signal, and includes, but are not limited to, a combination of one or more logic devices such as a flip-flop, a gate circuit, a latch, and a selector.

In a further embodiment, an inner part of the memory chip 11 can be provided with at least a first preprocessing unit 112. The first preprocessing unit 112 is configured to receive, preprocess, and then output the external input signal. The preprocessing includes at least one of the following: noise reduction, filtering, shaping, error checking and correction (ECC), signal enhancement, and data buffering. The inner part of the expansion chip 12 can be provided with at least a second preprocessing unit 122 and a third preprocessing unit 123. The second preprocessing unit 122 is configured to receive, preprocess, and then output the external input signal. The third preprocessing unit 123 is configured to receive, preprocess, and then output the first control signal. The preprocessing includes at least one of the following: noise reduction, filtering, shaping, error correction (e.g., error checking and correction (ECC)), signal enhancement, and data buffering.

Preferably, each of pins of each of the chips in the inner part of the package body 100 is provided with a corresponding preprocessing unit. After one of the signals (including a signal input from an outside of the package body 100 and a signal transmitted between the chips in the inner part of the package body 100) enters the inner part of each of the chips through any one of the pins (including a sharing pin and an inter-chip pin), the one of the signals first enters the corresponding preprocessing unit for the one of the signals to be preprocessed. Because after the one of the signals enters each of the chips through any one of the pins, there can be at least one problem such as jitter, superimposed noise, and/or weak signal strength. After the preprocessing, the one of the signals can be effectively improved, and a success rate of performing subsequent operations on the one of the signals can be increased. Preferably, each of the preprocessing units can include a plurality of processing modules which respectively implement functions such as noise reduction, filtering, and data buffering. Each of the preprocessing units can implement same functions, or the preprocessing units correspondingly configured for actually received signals can implement different functions accordingly.

In a further embodiment, an inner part of the memory chip 11 is provided with a first decoder (command decoder) 114. The first decoder 114 is configured to receive and decode the external input signal and generate the first control signal. The first decoder 114 can generate, according to a continuous read mode enable signal in the external input signal, the first control signal that disables the input function of the expansion chip. Specifically, after the first decoder 114 receives the multi-channel continuous read command signal and the address signal, according to bits of the continuous read mode that are correspondingly set, the first decoder 114 decodes out the continuous read mode enable signal, and then generates the first control signal that disables the input function of the expansion chip. In another case, the first decoder 114 generates, according to the external input signal, the first control signal that enables the input function of the expansion chip. The inner part of the expansion chip 12 is provided with a second decoder 124. The second decoder 124 is configured to receive and decode the external input signal when the first control signal enables the input function of the expansion chip 12. Each of the decoders can be implemented using the prior art that can implement decoding functions. Details are omitted here.

In a further embodiment, the prohibition of the transmission of the external input signal in the expansion chip 12 is any one of the following: setting all of the signals (i.e., the first control signal or the first control signal that has been logically operated) transmitted into the second decoder 124 to be 0, setting all of the signals transmitted into the second decoder 124 to be 1, and disconnecting a transmission path between the external input signal and the second decoder 124. Any one of the above operations causes the external input signal that is normal to be unable to be transmitted into the second decoder 124.

In the present embodiment, by arranging a pair of inter-chip pins connected to each other between chips in an inner part of a package body, the memory chip 11 can transmit, through the pair of inter-chip pins, a first control signal that disables or enables an input function of the expansion chip 12 to the expansion chip 12. When the input function of the expansion chip 12 is disabled, the transmission of the external input signal in the expansion chip 12 is prohibited regardless of a state of the expansion chip 12. Thus, the two chips are in an asynchronous state, which can prevent the expansion chip 12 from misreading the signal, and enhance stability of the expansion chip 12. By further configuring a second control signal in the expansion chip 12 to select receiving the first control signal or select enabling the input function of the expansion chip 12, a testing of the expansion chip 12 or an application of the expansion chip 12 that is individually packaged is applicable. At the same time, by controlling the expansion chip 12 through the first control signal and the second control signal, the input function of the expansion chip 12 can be disabled without putting the expansion chip 12 into a standby mode. Thus, when a command needs to be input to the expansion chip 12, only the corresponding control signal needs to be changed, and then the expansion chip 12 can respond quickly so that the external input signal can be transmitted normally in the expansion chip. Moreover, a pin arrangement of the memory packaged chip 10 can be compatible with an existing pin packaging process of a memory chip, reducing difficulty of a packaging process, and improving an application range of the memory packaged chip that is packaged.

Figure 4A:
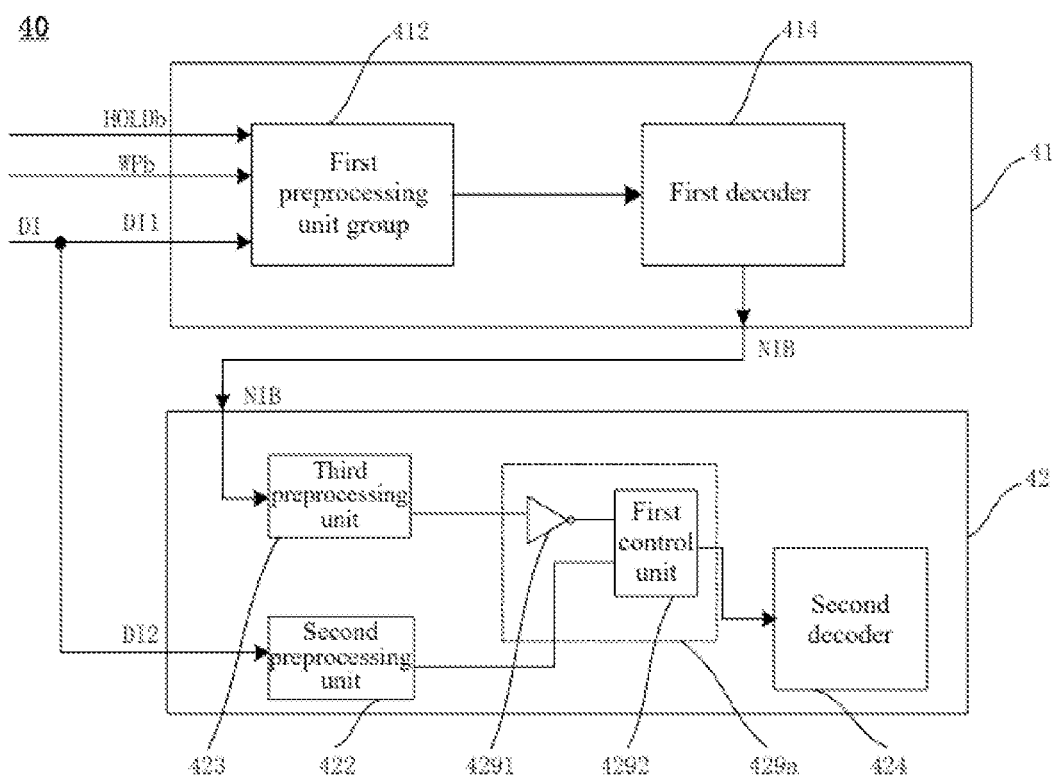
FIG. 4A is a schematic diagram of a circuit in an inner part of a memory packaged chip provided according to a second embodiment of the present application.

Referring to FIG. 4A, FIG. 4A is a schematic diagram of a circuit in an inner part of a memory packaged chip provided according to a second embodiment of the present application. As illustrated in FIG. 4A, in the present embodiment, an inner part of a package body of the memory packaged chip 40 includes an SPI flash chip 41 and an RPMC chip 42. A spacing between the two chips and a side-by-side arrangement of the two chips illustrated in the figure are only for convenience of schematic illustration and do not limit an actual spacing between the two chips and a specific arrangement of the two chips in the inner part of the package body. The two chips can also use a vertical stack arrangement.

Specifically, the SPI flash chip 41 includes an input sharing pin DI1 connected to an external input pin DI, a command shield sharing pin HOLDb connected to an external command shield pin/HOLD, a write protection sharing pin WPb connected to the external write protection pin/WP, and an inter-chip pin NIB. The SPI flash chip 41 further includes a first preprocessing unit group 412 having a plurality of first preprocessing units, and a first decoder 414. The following should be noted. The SPI flash chip 41 further includes corresponding sharing pins connected to an external chip select pin/CS, an external output pin DO, an external ground pin GND, an external clock pin CLK, and an external power supply pin VCC. Other pins can also be added according to functional requirements. In order to clearly illustrate inventive points of the present application, only some pins are depicted in the figure.

The SPI flash chip 41 receives an external input signal through the external input pin DI. The external input signal is preprocessed and then output by a corresponding first preprocessing unit of the first preprocessing unit group 412. (Each of the preprocessing units can implement same functions, or the preprocessing units correspondingly configured for actually received signals can implement different functions accordingly.) The first decoder 414 decodes the external input signal that is preprocessed. After the SPI flash chip 41 receives a multi-channel continuous read command signal and an address signal, according to bits of a continuous read mode that are correspondingly set, the first decoder 414 decodes out a continuous read mode enable signal, and then generates a first control signal that disables the input function of the RPMC chip 42. The SPI flash chip 41 transmits the first control signal to the RPMC chip 42 through the inter-chip pin NIB.

Specifically, the RPMC chip 42 includes an input sharing pin DI2 connected to the external input pin DI, an inter-chip pin NIB, a second preprocessing unit 422, and a third preprocessing unit 423 (the second preprocessing unit 422 and the third preprocessing unit 423 can implement same functions, or can implement different functions according to actually received signals), a logic processing unit 429a, and a second decoder 424. The following should be noted. The RPMC chip 42 further includes corresponding sharing pins respectively connected to the external chip select pin/CS, the external output pin DO, the write protection pin/WP, the external ground pin GND, the external clock pin CLK, the external command shield pin/HOLD, and the external power supply pin VCC. Other pins can also be added according to functional requirements. In order to clearly illustrate the inventive points of the present application, only some pins are depicted in the figure.

The RPMC chip 42 receives the external input signal (which is same as the external input signal received by the SPI flash chip 41) through the external input pin DI. The external input signal is preprocessed and then output by the second preprocessing unit 422. (The preprocessing can include noise reduction, filtering, shaping, error correction, signal enhancement, and data buffering.) The RPMC chip 42 further receives the first control signal through the inter-chip pin NIB. The first control signal is preprocessed and then output by the third preprocessing unit 423. (The preprocessing can include noise reduction, filtering, shaping, error correction, and signal enhancement.) The logic processing unit 429a receives and performs logic operation on the external input signal and the first control signal to prohibit or allow transmission of the external input signal in the RPMC chip 42. When the first control signal is a signal that disables the input function of the RPMC chip 42, the external input signal that is preprocessed is prohibited from being input to the second decoder 424, thereby preventing the second decoder 424 from mis-decoding the external input signal. When the first control signal is a signal that enables the input function of the RPMC chip 42, the external input signal that is preprocessed is input to the second decoder 424. The second decoder 424 decodes the external input signal that has been received.

Specifically, the logic processing unit 429a includes an inverter 4291 and a first control unit 4292. The inverter 4291 is configured to receive and invert the first control signal. The first control unit 4292 receives the external input signal and the first control signal that has been inverted. When the first control signal is a signal that disables the input function of the RPMC chip 42, the first control unit 4292 prohibits the external input signal from being output to the second decoder 424. When the first control signal is a signal that enables the input function of the RPMC chip 42, the first control unit 4292 outputs the external input signal to the second decoder 424.

The following is to be noted. The first control unit 4292 can consist of a circuit that include a logic device. Specifically, the logic device includes, but are not limited to, an analog logic device and a digital logic device. The analog logic device is a device configured to process an analog electrical signal, and includes, but are not limited to, a combination of one or more logic devices such as a comparator, a Schmitt, an inverter, an AND gate, and an OR gate.

The digital logic device is a device configured to process a digital signal represented by a pulse signal, and includes, but are not limited to, a combination of one or more logic devices such as a flip-flop, a gate circuit, a latch, and a selector.

Figure 4B:
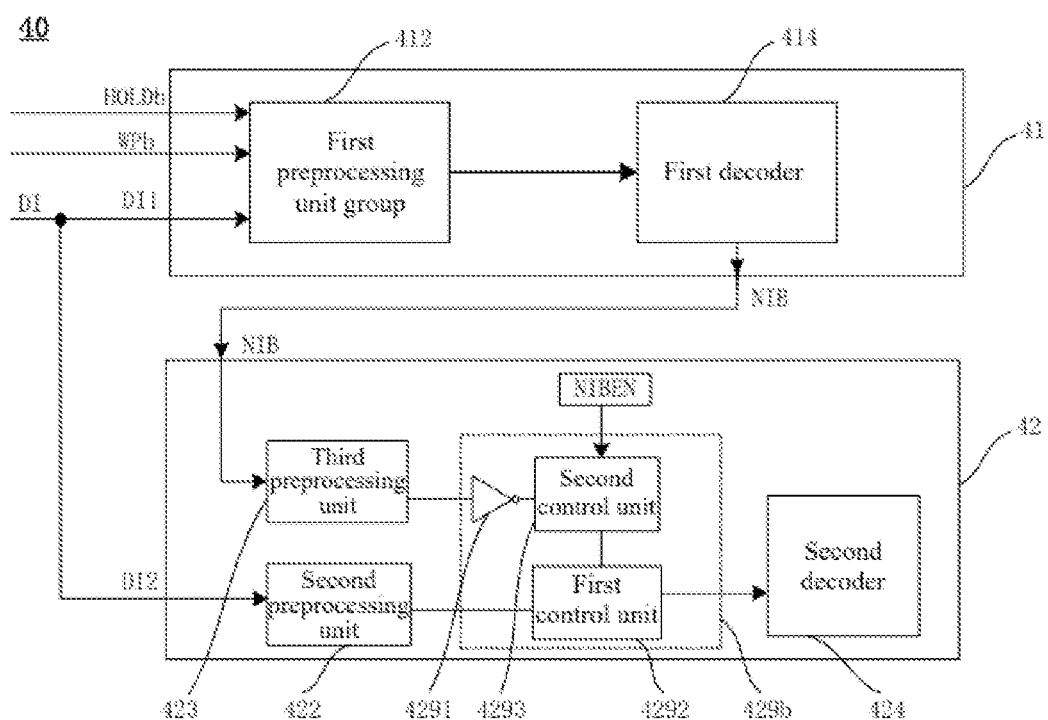
FIG. 4B is a schematic diagram of a circuit in an inner part of a memory packaged chip provided according to a third embodiment of the present application.

Referring to FIG. 4B, FIG. 4B is a schematic diagram of a circuit in an inner part of a memory packaged chip provided according to a third embodiment of the present application. As illustrated in FIG. 4B, an embodiment illustrated in FIG. 4B is different from the embodiment illustrated in FIG. 4A in that in the present embodiment, the RPMC chip 42 is further configured to configure a second control signal to select receiving the first control signal or select enabling the input function of the RPMC chip 42. Specifically, at least one state bit NIBEN is stored in the inner part of the RPMC chip 42. By setting a value of the at least one state bit NIBEN, the corresponding second control signal can be generated. For example, the setting of the at least one state bit NIBEN can be implemented by one bit. When the RPMC chip 42 is in a state of being individually tested or individually packaged, by setting the value of the state bit NIBEN to 0 (the value of the state bit NIBEN can be set before leaving the factory and can also be changed by an external command input by a user according to his/her need), the input function of the RPMC chip 42 is directly enabled so that the RPMC chip 42 can normally receive external input signals. When a testing of the RPMC chip 42 is finished and when the RPMC chip 42 is packaged together with the SPI flash chip 41, by setting the value of the state bit NIBEN to 1 (the value of the state bit NIBEN can be set before leaving the factory and can also be changed by an external command input by the user according to his/her need), the first control signal transmitted through the internal communication pin NIB can be normally received.

Specifically, the logic processing unit 429b includes an inverter 4291 and a first control unit 4292 and a second control unit 4293. The inverter 4291 is configured to receive and invert the first control signal. The second control unit 4293 is configured to receive and perform logic operation on the second control signal and the first control signal that has been inverted, and output a logic control signal. The logic control signal is a signal that enables the input function of the RPMC chip 42 or is the first control signal that has been logically operated. In the present embodiment, the first control signal that has been logically operated is the first control signal that has been inverted. When the second control signal is a signal that enables the input function of the RPMC chip 42, the second control unit 4293 outputs a logic control signal that enables the input function of the RPMC chip 42 and prohibits transmission of the first control signal that has been inverted. When the second control signal is a signal that allows the first control signal to be transmitted, the second control unit 4293 allows the transmission of the first control signal that has been inverted. The first control unit 4292 receives the external input signal and the logic control signal. When the logic control signal is a signal that enables the input function of the RPMC chip 42, transmission of the external input signal in the RPMC chip 42 is allowed. When the logic control signal is the first control signal that has been logically operated, the transmission of the external input signal in the RPMC chip 42 is prohibited or allowed according to the first control signal. That is, the transmission of the first control signal is controlled by the second control signal. When the second control signal is a signal that enables the transmission of the first control signal, the transmission of the external input signal is controlled by the first control signal.

Optionally, according to different control logic, the logic processing unit 429b may not include the inverter 4291. At this time, the logic processing unit 429b includes a first control unit 4292 and a second control unit 4293. The second control unit 4293 is configured to receive and perform logic operation on the second control signal and the first control signal, and output a logic control signal. The logic control signal is a signal that enables the input function of the RPMC chip 42 or is the first control signal that has been logically operated. When the second control signal is a signal that enables the input function of the RPMC chip 42, the second control unit 4293 outputs a logic control signal that enables the input function of the RPMC chip 42 and prohibits transmission of the first control signal in the RPMC chip 42. When the second control signal is a signal that allows the first control signal to be transmitted, the second control unit 4293 allows the transmission of the first control signal. The first control unit 4292 receives the external input signal and the logic control signal. When the logic control signal is a signal that enables the input function of the RPMC chip 42, transmission of the external input signal in the RPMC chip 42 is allowed. When the logic control signal is the first control signal that has been logically operated, the transmission of the external input signal in the RPMC chip 42 is prohibited or allowed according to the first control signal. That is, the transmission of the first control signal is controlled by the second control signal. When the second control signal is a signal that enables the transmission of the first control signal, the transmission of the external input signal is controlled by the first control signal. At this time, optionally, when the second control signal is a signal that enables the input function of the RPMC chip 42, the second control unit 4293 can output a signal that enables the input function of the RPMC chip 42 as the logic control signal; and when the second control signal is a signal that allows the transmission of the first control signal, the second control unit 4293 outputs the first control signal that has been logically operated as the logic control signal. The first control unit 4292 performs logical judgement on the logic control signal and the external input signal that have been received. When the logic control signal is a signal that enables the input function of the RPMC chip 42, the first control unit 4292 allows the transmission of the external input signal in the RPMC chip 42. When the logic control signal is the first control signal, the first control unit 4292 judges whether to allow the transmission of the external input signal in the RPMC chip 42 according to a command of the first control signal. According to different designs of the first control signal, the first control signal that has been logically operated can be the first control signal that has been inverted, or can be the first control signal itself directly. Meanwhile, integrating the inverter 4291 into the second control unit 4293 is not excluded.

The following is to be noted. The first control unit 4292 and the second control unit 4293 can consist of a circuit that include a logic device. Specifically, the logic device includes, but are not limited to, an analog logic device and a digital logic device. The analog logic device is a device configured to process an analog electrical signal, and includes, but are not limited to, a combination of one or more logic devices such as a comparator, a Schmitt, an inverter, an AND gate, and an OR gate. The digital logic device is a device configured to process a digital signal represented by a pulse signal, and includes, but are not limited to, a combination of one or more logic devices such as a flip-flop, a gate circuit, a latch, and a selector.

On the basis of a same inventive concept, the present application also provides a signal processing method for a memory packaged chip.

Figure 5:
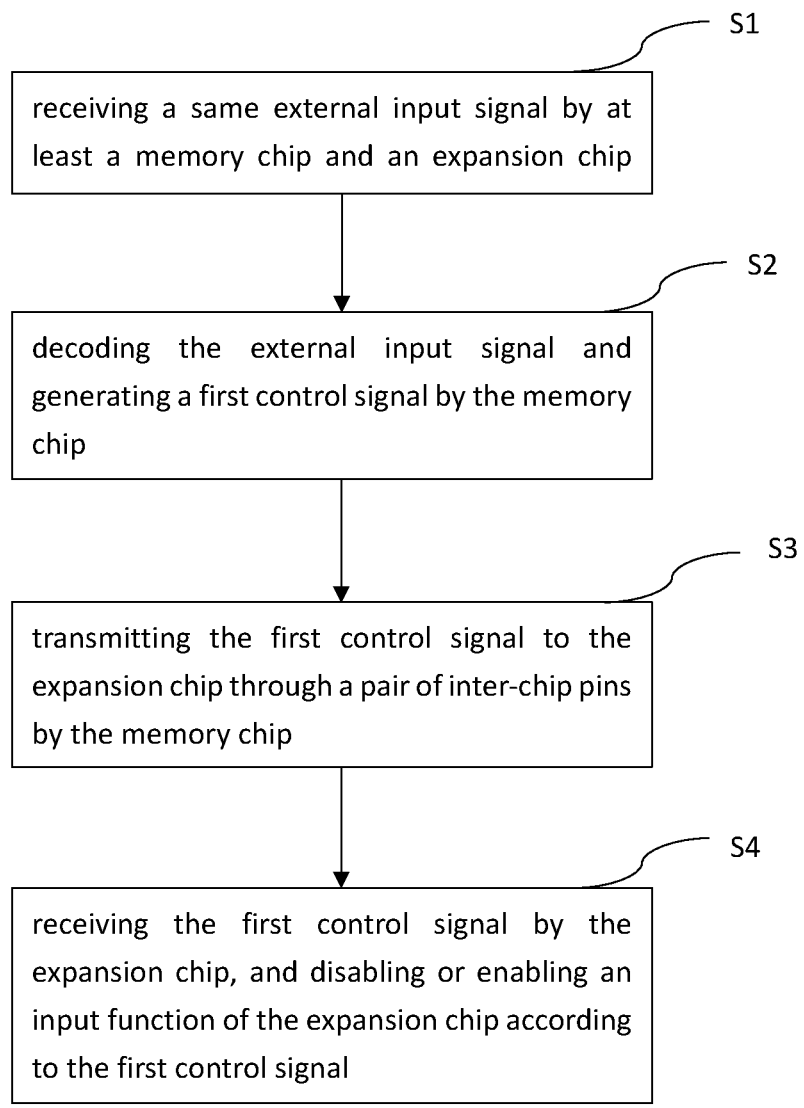
FIG. 5 is a flowchart of a signal processing method for a memory packaged chip provided according to a fourth embodiment of the present application.

Referring to FIG. 5, FIG. 5 is a flowchart of a signal processing method for a memory packaged chip provided according to a fourth embodiment of the present application. An inner part of a package body of the memory packaged chip includes at least a memory chip and an expansion chip. There are a pair of inter-chip pins connected to each other between the memory chip and the expansion chip. The method includes the following steps: a step S1 of receiving a same external input signal by at least a memory chip and an expansion chip respectively; a step S2 of decoding the external input signal and generating a first control signal by the memory chip; a step S3 of transmitting the first control signal to the expansion chip through a pair of inter-chip pins by the memory chip; a step S4 of receiving the first control signal by the expansion chip, and disabling or enabling an input function of the expansion chip according to the first control signal.

In a further embodiment, there are a pair of input sharing pins between the memory chip and the expansion chip. The pair of input sharing pins are configured to receive the same external input signal. The pair of input sharing pins are connected to a same external input pin. The step S1 includes, by the memory chip and the expansion chip, receiving the same external input signal through the external input pin.

In a further embodiment, the step S1 can include, by the memory chip and the expansion chip, preprocessing the external input signal that has been received. The preprocessing includes at least one of the following: noise reduction, filtering, shaping, error correction, and signal enhancement. In the step S4, the step of, by the expansion chip, receiving the first control signal can include, by the expansion chip, preprocessing the first control signal that has been received. The preprocessing includes at least one of the following: noise reduction, filtering, shaping, error correction, and signal enhancement. Because after one of the signals enters each of the chips through one of the pins, there can be at least one problem such as jitter, noise introduction, and/or weak signal strength. After the preprocessing, the one of the signals can be effectively improved, and a success rate of performing subsequent operations on the one of the signals can be increased. According to actually received signals, same preprocessing can be performed, or different preprocessing can be performed.

In a further embodiment, the step S2 includes, by the memory chip, generating, according to a continuous read mode enable signal in the external input signal, the first control signal that disables the input function of the expansion chip. Specifically, after the memory chip receives a multi-channel continuous read command signal and an address signal, according to a continuous read mode enable signal in the external input signal, the memory chip generates the first control signal that disables the input function of the expansion chip. Because an external pin is shared, the memory chip and the expansion chip receive the same external input signal. (For example, execution starts after the pin/CS is brought to a low level.) After the memory chip receives the multi-channel continuous read command signal and the address signal, according to bits of a continuous read mode that are correspondingly set and are in a condition that enables the continuous read mode, for a next read command, a read command code does not need to be input, and a read address can be input directly. In this case, the expansion chip may mistakenly treat the read address input this time for the memory chip as a read command for the expansion chip, thereby causing the expansion chip to mis-decode it. In the present embodiment, when the memory chip decodes out a continuous read mode enable signal, the memory chip transmits the first control signal that disables the input function of the expansion chip through the pair of inter-chip pins so that the expansion chip does not misread the external input signal, and is prevented from mis-decoding the external input signal of the read address. Signal transmission on the pair of inter-chip pins is unidirectional and is only from the memory chip to the expansion chip.

Specifically, in the step S4, when the input function of the expansion chip is disabled, transmission of the external input signal in the expansion chip is prohibited. When the input function of the expansion chip is enabled, the transmission of the external input signal in the expansion chip is allowed.

In a further embodiment, the step S4 includes receiving and inverting the first control signal; receiving the external input signal and the first control signal that has been inverted, and when the first control signal is a signal that disables the input function of the expansion chip, prohibiting the transmission of the external input signal in the expansion chip, and when the first control signal is a signal that enables the input function of the expansion chip, allowing the transmission of the external input signal in the expansion chip. Specifically, when the first control signal is the signal that disables the input function of the expansion chip, a forward transmission of the external input signal received by the expansion chip is prohibited. That is, the input function of the expansion chip is disabled. When the first control signal is the signal that enables the input function of the expansion chip, the forward transmission of the external input signal received by the expansion chip is allowed so that a subsequent decoding operation can be performed. That is, the input function of the expansion chip is enabled.

In a further embodiment, the method further includes, by the expansion chip, configuring a second control signal to select receiving the first control signal or select enabling the input function of the expansion chip. When the expansion chip is individually tested or individually packaged, the inter-chip pin of the expansion chip is in a floating state. In order to prevent signals (including the first control signal) input through the inter-chip pin of the expansion chip from affecting normal reads of the chip and thus affecting test accuracy or performance of the chip itself, in the present embodiment, in the expansion chip, a second control signal is configured for reception of the first control signal to be selected or direct enablement of the input function of the expansion chip to be selected.

In a further embodiment, the step of, by the expansion chip, configuring a second control signal to select receiving the first control signal or select enabling the input function of the expansion chip includes the following: 1) receiving and performing logic operation on the second control signal and the first control signal, and outputting a logic control signal, wherein the logic control signal is a signal that enables the input function of the expansion chip or is the first control signal that has been logically operated; 2) receiving the external input signal and the logic control signal and when the logic control signal is the signal that enables the input function of the expansion chip, allowing transmission of the external input signal in the expansion chip, and when the logic control signal is the first control signal that has been logically operated, prohibiting or allowing the transmission of the external input signal in the expansion chip according to the first control signal. When the second control signal is the signal that enables the input function of the expansion chip, the logic control signal is the signal that enables the input function of the expansion chip, and at the same time, transmission of the first control signal is prohibited. When the second control signal is a signal that allows the transmission of the first control signal, the transmission of the external input signal is controlled by the first control signal. That is, when the first control signal is a signal that disables the input function of the expansion chip, the transmission of the external input signal in the expansion chip is prohibited. When the first control signal is a signal that enables the input function of the expansion chip, the transmission of the external input signal in the expansion chip is allowed.

In a further embodiment, the memory chip is an SPI flash chip. The expansion chip is an RPMC chip. The SPI flash chip and the RPMC chip use their respective internal communication pins respectively as the inter-chip pins forming the pair of inter-chip pins. For an arrangement manner and an operating principle of the SPI flash chip and the RPMC chip, refer to FIG. 4A or FIG. 4B. Details are omitted here.

In the present embodiment, by arranging a pair of inter-chip pins connected to each other between chips in an inner part of a package body, the memory chip can transmit, through the pair of inter-chip pins, a first control signal that disables or enables an input function of the expansion chip to the expansion chip. Thus, the expansion chip is prevented from misreading a signal, and stability of the expansion chip is enhanced. By further configuring a second control signal in the expansion chip to select receiving the first control signal or select directly enabling the input function of the expansion chip, a testing of the expansion chip or an application of the expansion chip that is individually packaged is applicable.

It can be understood that, to persons skilled in the art, in accordance with the technical solutions of the present application and an inventive concept thereof, equivalent replacements or changes can be made. All of these changes and replacements should fall within the protection scopes of the appended claims of the present application.

What is claimed is:

1. A memory packaged chip, comprising a package body, wherein an inner part of the package body comprises at least a memory chip and an expansion chip capable of receiving a same external input signal;
   wherein there are a pair of inter-chip pins connected to each other between the memory chip and the expansion chip;
   wherein the memory chip is further configured to generate a first control signal according to the external input signal, and transmit the first control signal to the expansion chip through the pair of inter-chip pins to disable or enable an input function of the expansion chip, causing the expansion chip and the memory chip to be in a non-synchronous state; and wherein when the input function of the expansion chip is disabled, a transmission of the external input signal in the expansion chip is prohibited; and when the input function of the expansion chip is enabled, the transmission of the external input signal in the expansion chip is allowed.

2. The memory packaged chip of claim 1, wherein the external input signal comprises a continuous read mode enabling signal, and the memory chip generates, according to the continuous read mode enabling signal, the first control signal that disables the input function of the expansion chip.

3. The memory packaged chip of claim 1, wherein the inner part of the expansion chip is provided with a logic processing unit; and the logic processing unit is configured to perform a logic operation on the external input signal and the first control signal to prohibit or allow the transmission of the external input signal in the expansion chip.

4. The memory packaged chip of claim 3, wherein the logic processing unit comprises:
   an inverter configured to receive and invert the first control signal; and
   a first control unit configured to receive the external input signal and the first control signal that has been inverted, and configured to prohibit the transmission of the external input signal in the expansion chip when the first control signal is configured to a signal that disables the input function of the expansion chip, and to allow the transmission of the external input signal in the expansion chip when the first control signal is a signal that enables the input function of the expansion chip.

5. The memory packaged chip of claim 1, wherein an inner part of the memory chip is provided with at least a first preprocessing unit, and the first preprocessing unit is configured to receive the external input signal, perform a preprocess, and have an output; and wherein the preprocess comprises at least one of noise reduction, filtering, shaping, error correction, signal enhancement, and data buffering.

6. The memory packaged chip of claim 1, wherein the inner part of the expansion chip is provided with at least a second preprocessing unit and a third preprocessing unit; the second preprocessing unit is configured to receive the external input signal, perform a preprocess, and have an output; the third preprocessing unit is configured to receive the first control signal, perform a preprocess, and have an output; and the preprocess comprises at least one of noise reduction, filtering, shaping, error correction, signal enhancement, and data buffering.

7. The memory packaged chip of claim 1, wherein
   an inner part of the memory chip is provided with a first decoder, and the first decoder is configured to receive and decode the external input signal and generate the first control signal; and
   the inner part of the expansion chip is provided with a second decoder, and the second decoder is configured to receive and decode the external input signal when the first control signal is a signal that enables the input function of the expansion chip.

8. The memory packaged chip of claim 7, wherein the prohibited transmission of the external input signal in the expansion chip is done by one of setting all of the signals transmitted into the second decoder to be 0, setting all of the signals transmitted into the second decoder to be 1, and disconnecting a transmission path of the external input signal into the second decoder.

9. The memory packaged chip of claim 1, wherein the memory chip is a serial peripheral interface (SPI) flash chip, and the expansion chip is a replay protection monotonic counter (RPMC) chip; and the SPI flash chip and the RPMC chip use their respective internal communication pins respectively as the inter-chip pins.

10. The memory packaged chip of claim 1, wherein the expansion chip is further configured to provide a second control signal to select a step of receiving the first control signal or select a step of enabling the input function of the expansion chip.

11. The memory packaged chip of claim 10, wherein the inner part of the expansion chip is provided with a logic processing unit and the logic processing unit is configured to perform a logic operation on the external input signal, the first control signal, and the second control signal to prohibit or allow the transmission of the external input signal in the expansion chip.

12. The memory packaged chip of claim 11, wherein the logic processing unit comprises:
   a second control unit configured to receive and perform a logic operation on the second control signal and the first control signal, and output a logic control signal, wherein the logic control signal is a signal that enables the input function of the expansion chip or is the first control signal that has been logically operated; and
   a first control unit configured to receive the external input signal and the logic control signal, and configured to allow the transmission of the external input signal in the expansion chip when the logic control signal is the signal that enables the input function of the expansion chip, and prohibit or allow the transmission of the external input signal in the expansion chip according to the first control signal when the logic control signal is the first control signal that has been logically operated.

13. A signal processing method for the memory packaged chip, wherein an inner part of a package body of the memory packaged chip comprises at least a memory chip and an expansion chip, and there are a pair of inter-chip pins connected to each other between the memory chip and the expansion chip; and the method comprises the following steps:
   by the memory chip and the expansion chip, receiving a same external input signal;
   by the memory chip, decoding the external input signal and generating a first control signal;
   by the memory chip, transmitting the first control signal to the expansion chip through the pair of inter-chip pins; and
   by the expansion chip, receiving the first control signal, and disabling or enabling an input function of the expansion chip according to the first control signal, causing the expansion chip and the memory chip to be in a non-synchronous state; wherein when the input function of the expansion chip is disabled, a transmission of the external input signal in the expansion chip is prohibited; and when the input function of the expansion chip is enabled, the transmission of the external input signal in the expansion chip is allowed.

14. The method of claim 13, wherein the external input signal comprises a continuous read mode enabling signal, and the step of, by the memory chip, decoding the external input signal and generating a first control signal comprises, by the memory chip, generating, according to the continuous read mode enabling signal, the first control signal that disables the input function of the expansion chip.

15. The method of claim 13, wherein the step of, by the expansion chip, receiving the first control signal, and disabling or enabling an input function of the expansion chip according to the first control signal comprises:
   receiving and inverting the first control signal; and
   receiving the external input signal and the first control signal that has been inverted, and prohibiting the transmission of the external input signal in the expansion chip when the first control signal is a signal that disables the input function of the expansion chip, and allowing the transmission of the external input signal in the expansion chip when the first control signal is a signal that enables the input function of the expansion chip.

16. The method of claim 13, wherein the step of, by the memory chip and the expansion chip, receiving a same external input signal comprises:
   by the memory chip and the expansion chip, preprocessing the external input signal that has been received; wherein the preprocessing comprises at least one of noise reduction, filtering, shaping, error correction, signal enhancement, and data buffering.

17. The method of claim 13, wherein the step of, by the expansion chip, receiving the first control signal comprises, by the expansion chip, preprocessing the first control signal that has been received; and wherein the preprocessing comprises at least one of noise reduction, filtering, shaping, error correction, signal enhancement, and data buffering.

18. The method of claim 13, wherein the memory chip is an SPI flash chip, and the expansion chip is an RPMC chip; and the SPI flash chip and the RPMC chip use their respective internal communication pins respectively as the inter-chip pins.

19. The method of claim 13, wherein the method further comprises, by the expansion chip, configuring a second control signal to select a step of receiving the first control signal or select a step of enabling the input function of the expansion chip.

20. The method of claim 19, wherein the step of, by the expansion chip, configuring a second control signal to select a step of receiving the first control signal or select a step of enabling the input function of the expansion chip comprises:
   receiving and performing logic operation on the second control signal and the first control signal, and outputting a logic control signal, wherein the logic control signal is a signal that enables the input function of the expansion chip or is the first control signal that has been logically operated; and
   receiving the external input signal and the logic control signal, and allowing the transmission of the external input signal in the expansion chip when the logic control signal is the signal that enables the input function of the expansion chip and prohibiting or allowing the transmission of the external input signal in the expansion chip according to the first control signal when the logic control signal is the first control signal that has been logically operated.

* * * * *